United States Patent
Dehe

(10) Patent No.: US 9,708,180 B2
(45) Date of Patent: Jul. 18, 2017

(54) MEMS DEVICE WITH POLYMER LAYER, SYSTEM OF A MEMS DEVICE WITH A POLYMER LAYER, METHOD OF MAKING A MEMS DEVICE WITH A POLYMER LAYER

(71) Applicant: Infineon Technologies AG, Neubiberg (DE)

(72) Inventor: Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/684,700

(22) Filed: Apr. 13, 2015

(65) Prior Publication Data
US 2015/0210542 A1    Jul. 30, 2015

Related U.S. Application Data

(62) Division of application No. 13/743,300, filed on Jan. 16, 2013, now Pat. No. 9,006,845.

(51) Int. Cl.
*H01L 21/00* (2006.01)
*B81C 1/00* (2006.01)
*B81B 3/00* (2006.01)

(52) U.S. Cl.
CPC ........ *B81C 1/00325* (2013.01); *B81B 3/0072* (2013.01); *B81C 1/00158* (2013.01); *B81C 1/00182* (2013.01); *B81B 2201/0257* (2013.01); *B81C 2201/013* (2013.01); *B81C 2201/0159* (2013.01); *B81C 2201/0198* (2013.01)

(58) Field of Classification Search
CPC ......... H01L 2924/1461; H01L 41/0973; H01L 41/1138
USPC ............................ 257/415, 416, 420; 438/51
See application file for complete search history.

(56) References Cited

U.S. PATENT DOCUMENTS

| | | | |
|---|---|---|---|
| 6,522,762 B1 | 2/2003 | Mullenborn et al. | |
| 7,309,467 B2* | 12/2007 | Chen | B01D 57/02 422/50 |
| 7,311,794 B2* | 12/2007 | Joseph | B01L 3/50851 156/272.2 |
| 7,329,933 B2* | 2/2008 | Zhe | H04R 31/003 181/164 |
| 7,675,162 B2 | 3/2010 | Foster et al. | |
| 7,940,944 B2 | 5/2011 | Song | |
| 8,017,923 B2* | 9/2011 | Inoue | G01J 3/108 250/493.1 |
| 9,006,845 B2* | 4/2015 | Dehe | B81B 3/0072 257/415 |
| 2002/0145644 A1 | 10/2002 | Chen et al. | |

(Continued)

FOREIGN PATENT DOCUMENTS

| | | |
|---|---|---|
| CN | 101931852 A | 12/2010 |
| DE | 69928978 T2 | 8/2006 |
| JP | 2010104006 A | 5/2010 |

*Primary Examiner* — Tan N Tran
(74) *Attorney, Agent, or Firm* — Slater Matsil, LLP

(57) ABSTRACT

A MEMS device, a method of making a MEMS device and a system of a MEMS device are shown. In one embodiment, a MEMS device includes a first polymer layer, a MEMS substrate disposed on the first polymer layer and a MEMS structure supported by the MEMS substrate. The MEMS device further includes a first opening disposed in the MEMS substrate and a second opening disposed in the first polymer layer.

19 Claims, 12 Drawing Sheets

(56) References Cited

U.S. PATENT DOCUMENTS

| | | | |
|---|---|---|---|
| 2003/0186474 A1 | 10/2003 | Haluzak et al. | |
| 2007/0009377 A1* | 1/2007 | Goodrich | A61L 2/0011 422/24 |
| 2007/0042521 A1 | 2/2007 | Yama | |
| 2007/0113664 A1 | 5/2007 | Wang | |
| 2009/0169035 A1 | 7/2009 | Rombach et al. | |
| 2009/0288492 A1 | 11/2009 | Stewart et al. | |
| 2009/0295861 A1 | 12/2009 | Trauernicht et al. | |
| 2011/0045616 A1 | 2/2011 | Miyashita et al. | |
| 2012/0045078 A1 | 2/2012 | Lander | |
| 2012/0328142 A1 | 12/2012 | Horibe et al. | |
| 2014/0103460 A1* | 4/2014 | Dehe | H04R 19/005 257/415 |

\* cited by examiner

MEMS DEVICE WITH POLYMER LAYER, SYSTEM OF A MEMS DEVICE WITH A POLYMER LAYER, METHOD OF MAKING A MEMS DEVICE WITH A POLYMER LAYER

This is a divisional application of U.S. application Ser. No. 13/743,300, entitled "MEMS Device with Polymer Layer, System of a MEMS Device with a Polymer Layer, Method of Making a MEMS Device with a Polymer Layer" which was filed on Jan. 16, 2013 (now U.S. Pat. No. 9,006,845) and is incorporated herein by reference.

TECHNICAL FIELD

The present invention relates generally to a system and a method for manufacturing a micro-electromechanical system (MEMS) device.

BACKGROUND

Over the past years a desire for smaller electronic form factors and power consumption along with increased performance has driven an integration of MEMS devices. In particular, MEMS microphones may become smaller and smaller because electronic devices such as, e.g., cell phones, laptops, and tablets become smaller and smaller.

A feature in the performance of a MEMS microphone is the size of the MEMS device itself and the stress in the MEMS microphone generated during the manufacturing process.

SUMMARY OF THE INVENTION

In accordance with an embodiment of the present invention, a MEMS device comprising a first polymer layer, a MEMS substrate disposed on the first polymer layer and a MEMS structure supported by the MEMS substrate. The MEMS substrate further comprising a first opening disposed in the MEMS substrate and a second opening disposed in the first polymer layer.

In accordance with another embodiment of the present invention, a system comprises a carrier, an aperture disposed in the carrier, a MEMS device disposed on the aperture and a cap covering the MEMS device, wherein the MEMS device comprises a perforation in a first polymer layer, the perforation overlying the aperture.

In accordance with an embodiment of the present invention, a system comprises a carrier, a MEMS device disposed on the carrier, the MEMS device comprising a first polymer layer and a cap covering the MEMS device, the cap comprising an aperture.

In accordance with an embodiment of the present invention, a method for manufacturing a MEMS device comprising forming a MEMS structure supported by a substrate, forming a polymer layer on the substrate, exposing the polymer layer to a first pattern with a first light and exposing the polymer layer to a second pattern with a second light.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely silicon microphones. The invention may also be applied, however, to other microphones or MEMS devices.

MEMS device functionalities such as ventilation channels or back volume have been implemented in the encapsulation material or the substrate of the MEMS device. Manufacturing and placing these functionalities in the substrate and the encapsulation material provides certain limitations to the arrangement and the location of these functionalities.

Embodiments of the invention provide a polymer layer in the MEMS device such that certain MEMS functionalities can be implemented in that polymer layer. Advantages of embodiments of the invention are a higher degree of flexibility in arranging functionalities in MEMS devices vs. conventional MEMS devices. Other advantages maybe a reduction in etch process time and/or an elimination or reduction of stress.

Figure 1:
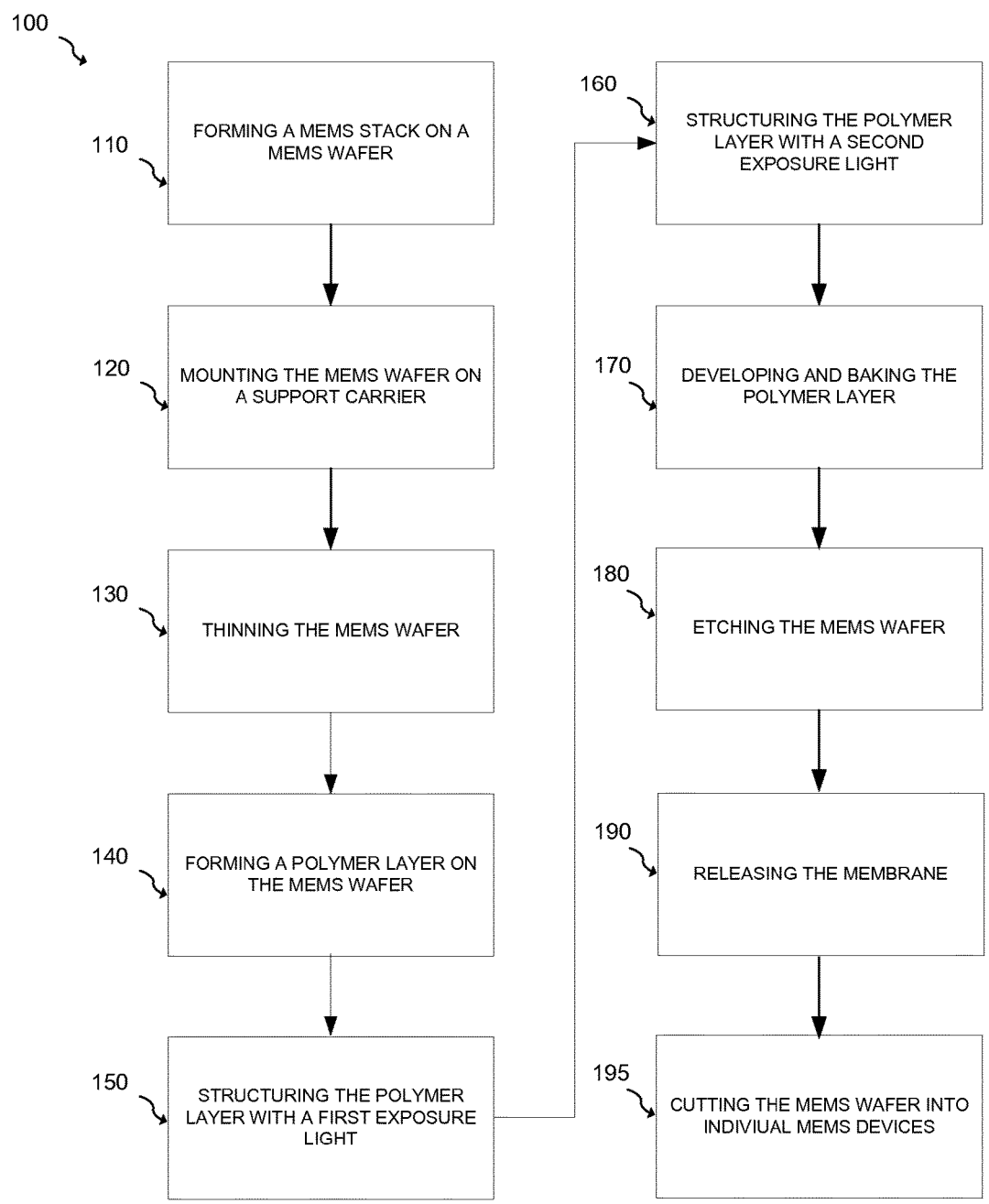
FIG. 1 shows an embodiment of a flowchart to manufacture a MEMS device.

FIG. 1 shows an embodiment of a flowchart of a MEMS manufacturing process 100. In a first step 110, a MEMS stack is formed in or on the substrate (typically a wafer). The MEMS stack is formed in or on a first main surface of the substrate. The MEMS stack comprises a membrane (e.g., a first electrode), a backplate (e.g., a second electrode) and a sacrificial layer between the membrane and the backplate. In one embodiment the MEMS stack comprises a membrane as a top layer. Alternatively, the MEMS stack comprises a backplate as a top layer of the layer. While using the term "stack," it is understood that a MEMS stack could include a single layer.

The MEMS stack is part of a MEMS device. The MEMS device may be a microphone or a silicon microphone. Alternatively, the MEMS device may comprise a transducer. The transducer may be a sensor such as a pressure sensor, an accelerometer, or a RF MEMS. The MEMS device may be a stand-alone device or alternatively may comprise additional devices such as an integrated circuit (IC). The integrated circuit may comprise a pre-amplifier and input/output terminals. Moreover, the integrated circuit (IC) may comprise an A/D converter or transistors, etc.

The substrate may comprise a semiconductive material such as silicon or germanium, or a compound semiconductor such as SiGe, GaAs, InP, GaN or SiC. Alternatively, the substrate may comprise organic materials such as glass or ceramic. The substrate (including the MEMS stack) may comprise a standard thickness of 600 µm to 700 µm.

In the next step 120, the substrate is placed or mounted on a support carrier. The substrate may be placed with its top surface on the support carrier. The support carrier may protect the MEMS stacks. The support carrier may comprise a support substrate and an adhesive layer. The adhesive layer moves into and fills the gaps between the MEMS stacks. The support substrate may be glass or an UV tape and the adhesive layer may be a wax or an otherwise adhesive material.

In step 130, the substrate is then thinned to a thickness of about 100 µm to about 150, to a thickness of about 100 µm to about 200 µm or to a thickness of about 100 µm to about 300 µm. The thinning of the substrate 110 may be carried out with an abrasive device or abrasive film. The thinning of the substrate may be carried out from the second main surface or bottom surface of the substrate.

In a next step 140 the MEMS wafer is flipped and a polymer layer is formed on the second main surface of the substrate. The polymer film may be a photo structurable polymer film. In one embodiment the polymer film may be an epoxy based negative photoresist. For example, the polymer film may be SU-8 resist. The SU-8 resist comprises a chemically amplified, epoxy based negative resist that is optically transparent and photo imagable to near UV (e.g., 365 nm) radiation. Cured SU-8 resist films or microstructures are very resistant to solvents, acids and bases and have excellent thermal and mechanical stability. The polymer film may be deposited or spun on the backside of the substrate. The polymer film may comprise a thickness of about 50 µm to about 100 µm, a thickness of about 100 µm to about 200 µm or to a thickness of about 50 µm to about 300 µm.

In step 150 the polymer layer is structured with a first pattern. The polymer film is exposed via first lithography mask to a first light from a first light source. The first lithography mask may comprise a first pattern. The first pattern of the first lithography mask images a first pattern in the polymer layer. The first pattern in the polymer layer comprises a plurality of small openings arranged in a circle. Alternatively, the plurality of small openings is arranged in an oval, rectangle, square or other suitable geometrical form. The small openings may be small round openings. The first light source may emit a first light with a first wavelength. The first wavelength may be 313 nm.

Figure 2A:
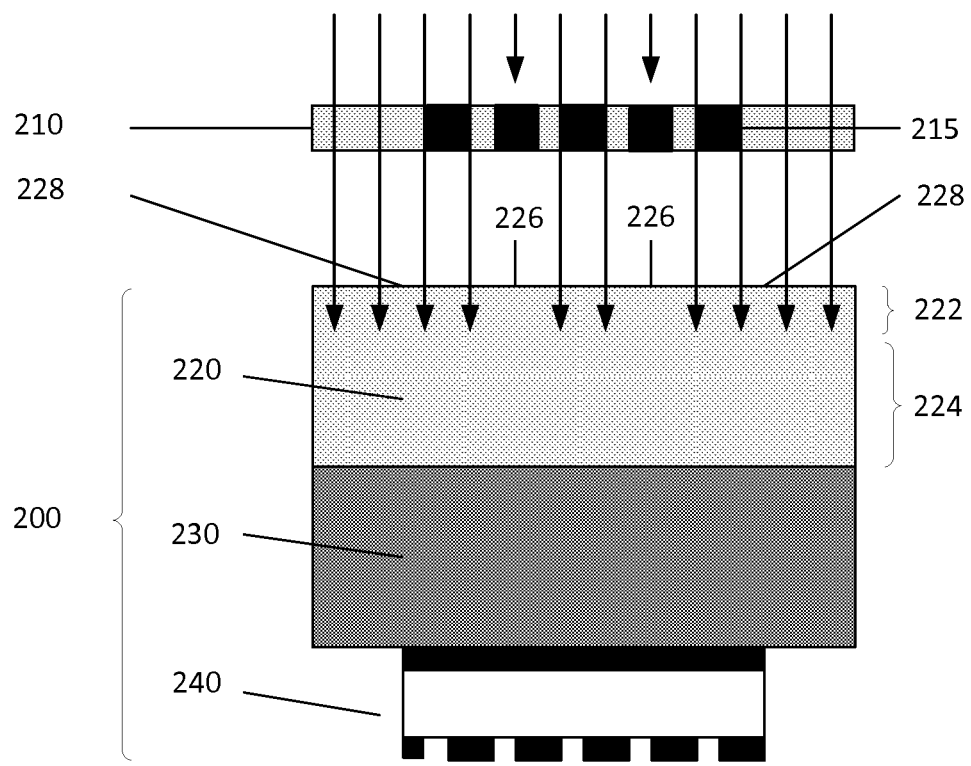
FIG. 2a-2h show embodiments of the MEMS device in different stages of the manufacturing process.
Figure 2B:
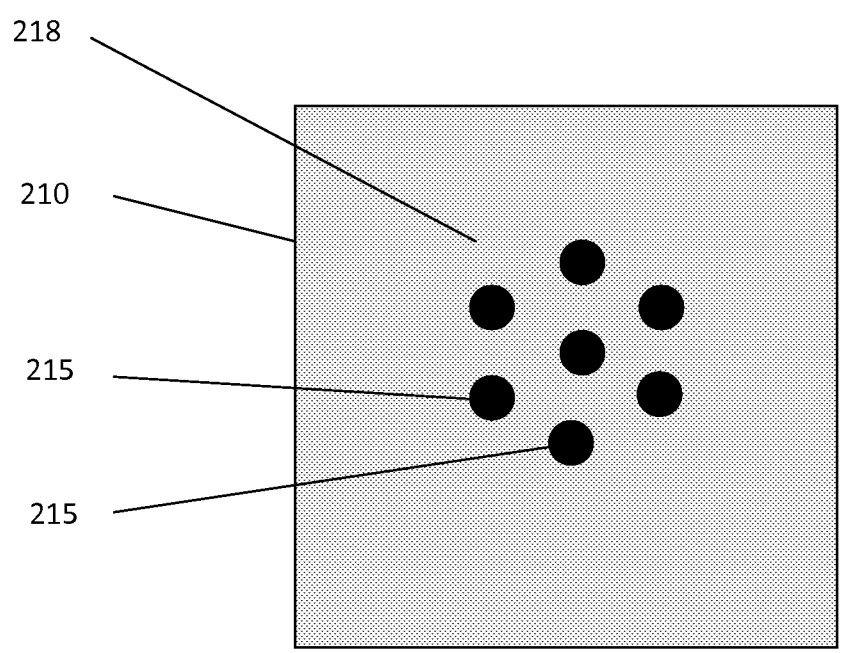

FIG. 2a shows a portion of a MEMS wafer 200 (e.g., a MEMS device with a polymer layer 220, a thinned substrate 230 and a MEMS structure 240) and a first lithography mask 210. The pattern of the first lithography mask may comprise small round structures 215 arranged in a circle 218. If the polymer layer 220 is a negative photoresist polymer layer, the small round structures 215 in the lithography mask 210 are opaque to the first light. FIG. 2b shows a top surface of the lithography mask 210.

The first wavelength of the first light is chosen such that it is substantially or completely absorbed in a top region 222 of the polymer layer 220. The first light does not penetrate the rest (e.g., a middle region and a lower region) 224 of the polymer layer 220. The exposure forms a first pattern in a top region 222 of the polymer layer 220. For example, the negative polymer layer 220 comprises unexposed small portions in a top surface and exposed large portions in the top surface.

In step 160 the polymer film is structured with a second pattern. The polymer film is exposed via second lithography mask to a second light from a second light source. The second lithography mask may comprise a second pattern. The second pattern may comprise a large structure, e.g., a large circle. Alternatively, the large structure may be an oval, a rectangle, a square or comprises an otherwise suitable geometrical form. The large structure may be larger than the round structures of the first pattern. The second light source may emit a second light with a second wavelength. The second wavelength may be 365 nm.

Figure 2C:
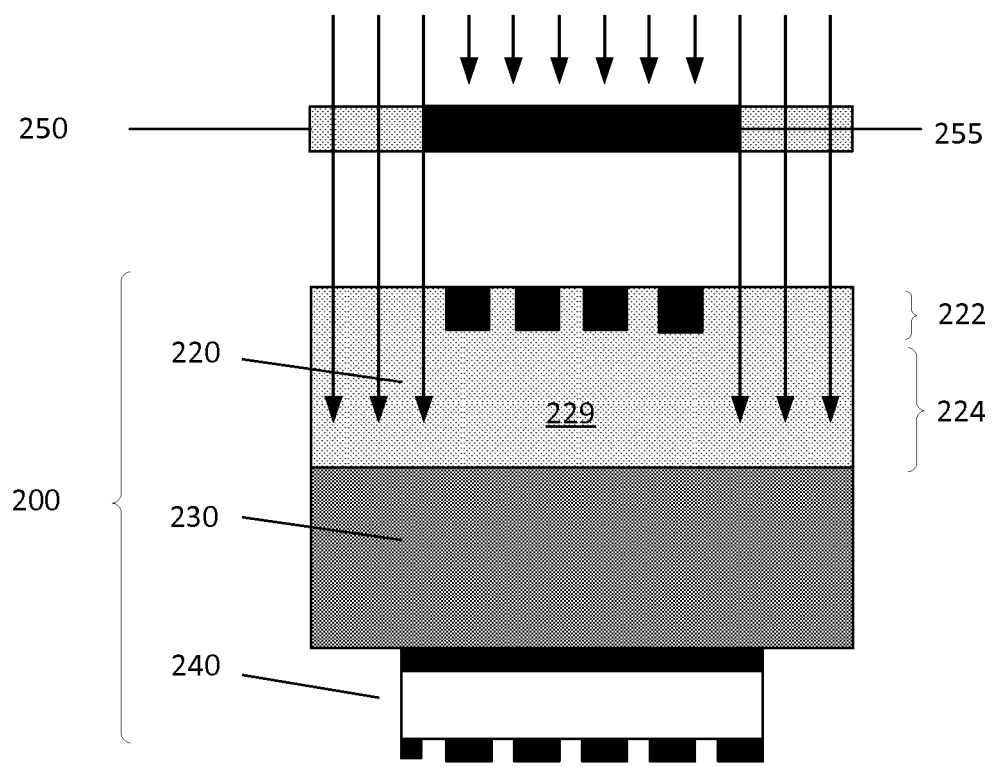
Figure 2D:
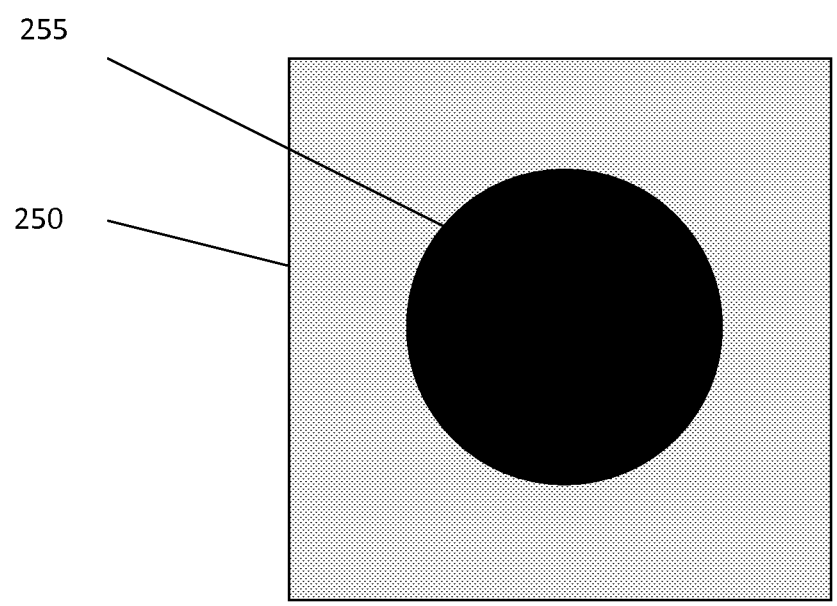

FIG. 2c shows a portion of a MEMS wafer 200 (e.g., a MEMS device with a polymer layer 220, a thinned substrate 230 and MEMS structure 240) and a second lithography mask 250. The pattern of the second lithography mask 250 comprises a large round structure 255. If the polymer layer 220 is a negative photoresist polymer layer, the large structure 255 in the second lithography mask 250 is opaque to the second light. FIG. 2d shows a top surface of the lithography mask 250.

The second wavelength of the second light is chosen such that it penetrates the entire height of the polymer layer 220 (region 222 and 224) and not only the top region 222. The exposure forms a second pattern in a region 229 of the polymer layer 220. For example, the negative polymer layer 220 comprises unexposed large portion 229.

In one embodiment, the first light may have a lower wavelength than the second light. The first light may be a light which is absorbed in the top region 222 of the polymer layer 220 and not over the entire height of the polymer layer 220. The second light may be a light which is absorbed over the entire height (222 and 224) of the polymer layer 220 and not only in a top region 224 of the polymer layer 220. The first light for the exposure of the first pattern may be high absorbing and low reaching and the second light for exposing the second pattern is low absorbing and deep reaching.

Figure 2E:
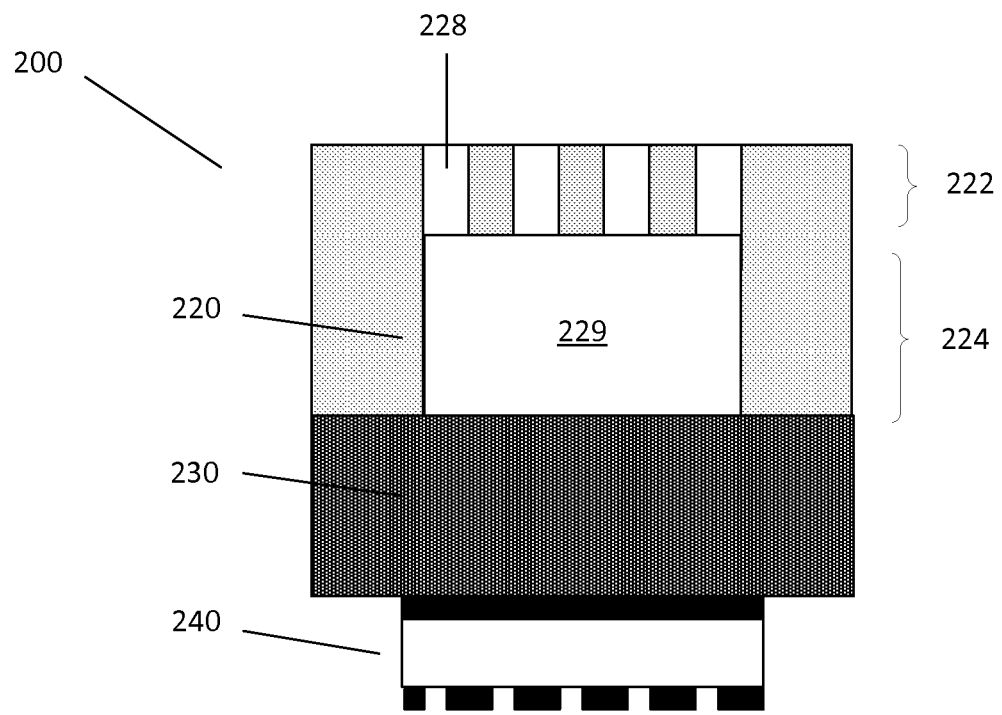
Figure 2F:
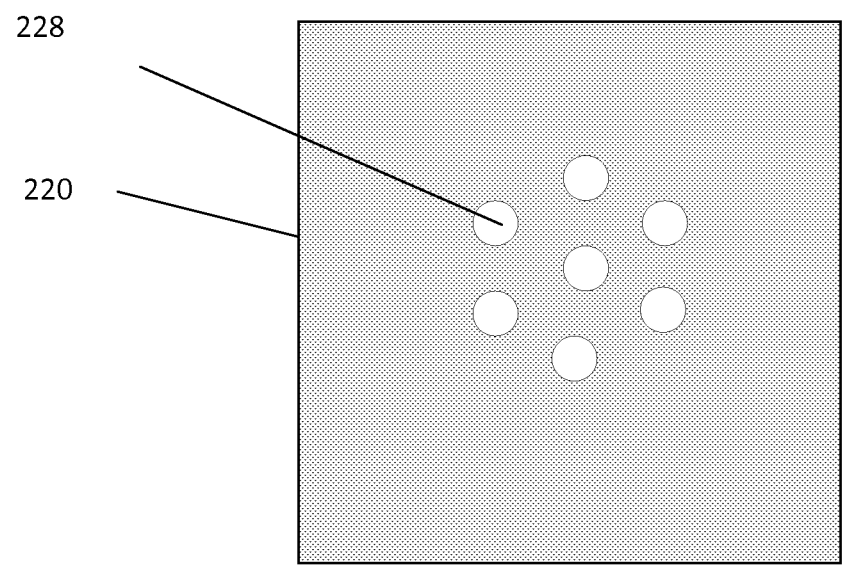

In step 170 the polymer film is then developed and baked. Developing the polymer layer leaves small openings 228 at a top region 222 of the polymer layer 220 and a large opening 229 in the lower and middle regions 224 of the polymer layer 220. FIGS. 2e and 2f show a cross sectional view and a bottom view of a polymer layer on a MEMS wafer.

Figure 2G:
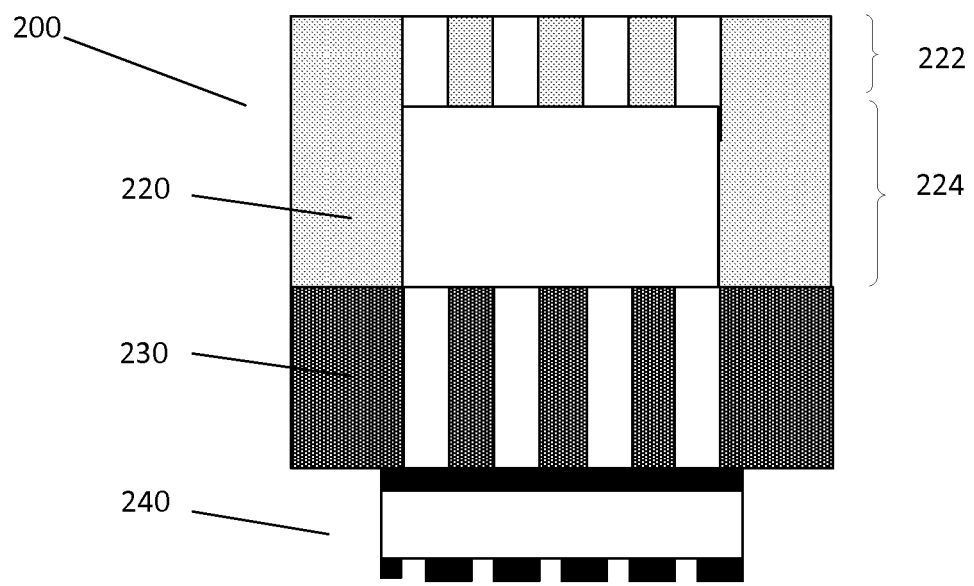
Figure 2H:
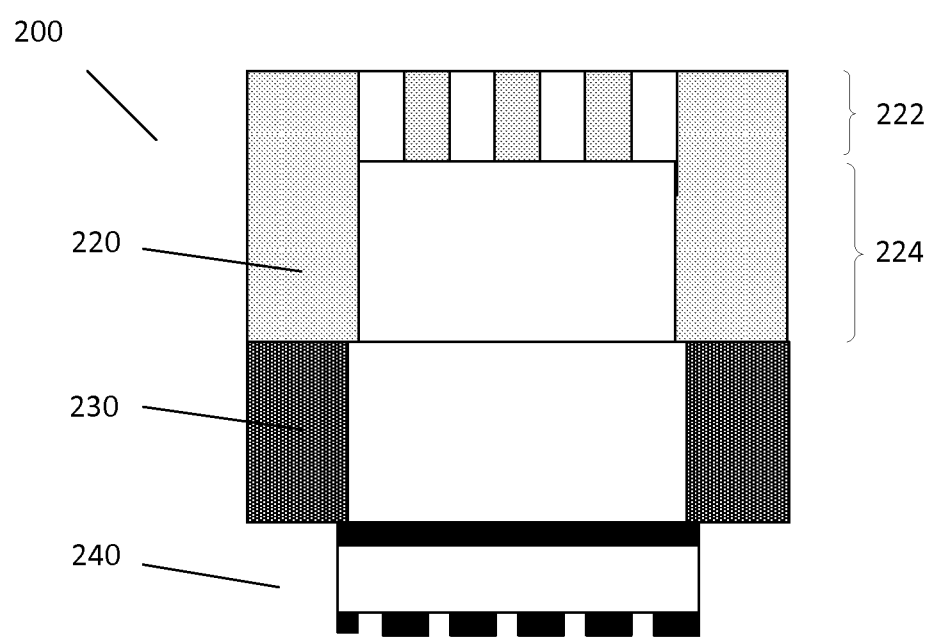

In step 180 the substrate is etched. The substrate may be etched applying a directional or anisotropic etch. The substrate may be anisotropically etched with a dry etch or a wet etch. For example, the substrate may be etched with a deep RIE. Openings are formed in the substrate. This is shown in FIG. 2g. Optionally, the openings in the substrate can be widened by applying an isotropic etch. The substrate may be isotropically etched with a dry etch or a wet etch. For example, the substrate may be etched with potassium hydroxide (KOH) or Tetramethyl ammonium hydroxide (TMAH). FIG. 2h shows the portion of the MEMS wafer after applying the isotropical etch. In one embodiment the substrate is isotropically etched all the way down to the MEMS stack 240.

In step 190 the membrane is released. The support carrier is removed before the membrane is released. The support carrier is removed from the substrate by pulling or detaching the support carrier from the substrate. The membrane is released by removing the sacrificial layer between the membrane and the backplate. For example the membrane is released by a wet chemical or vapor phase selective etching of the sacrificial oxide with HF based agents. The membrane is released such that spacers remain between the membrane and the backplate. The spacers may provide the support for the membrane and the backplate.

Finally, in step 195, the MEMS wafer is cut into individual MEMS devices. The MEMS wafer may be placed on a dicing foil (e.g., with the second main surface on the dicing foil) and cut such that individual MEMS devices are separated from each other.

Figure 3A:
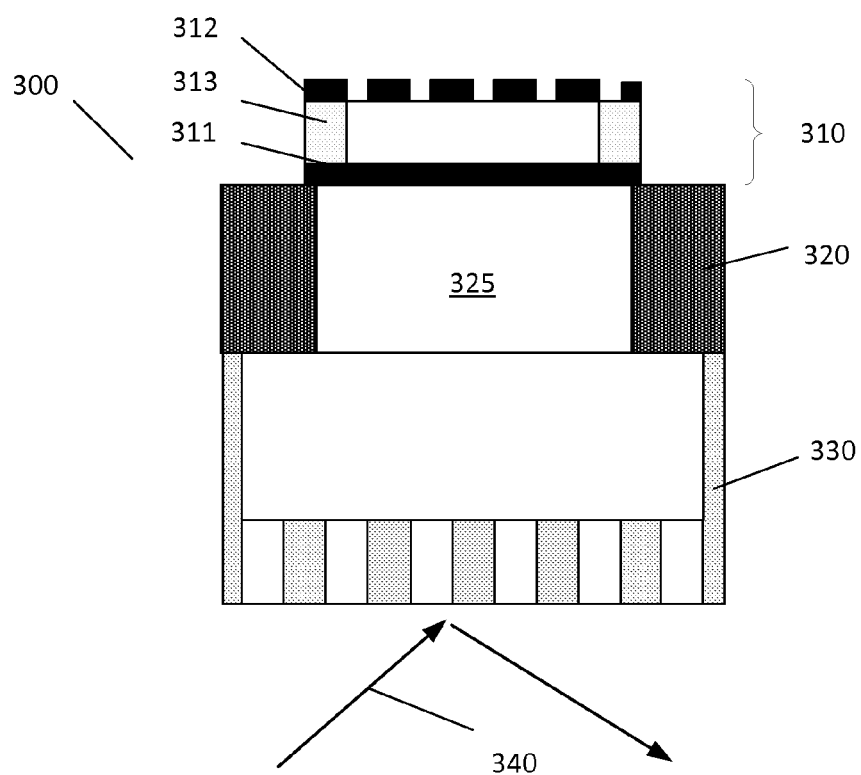
FIG. 3a shows an embodiment of a MEMS device.
Figure 3B:
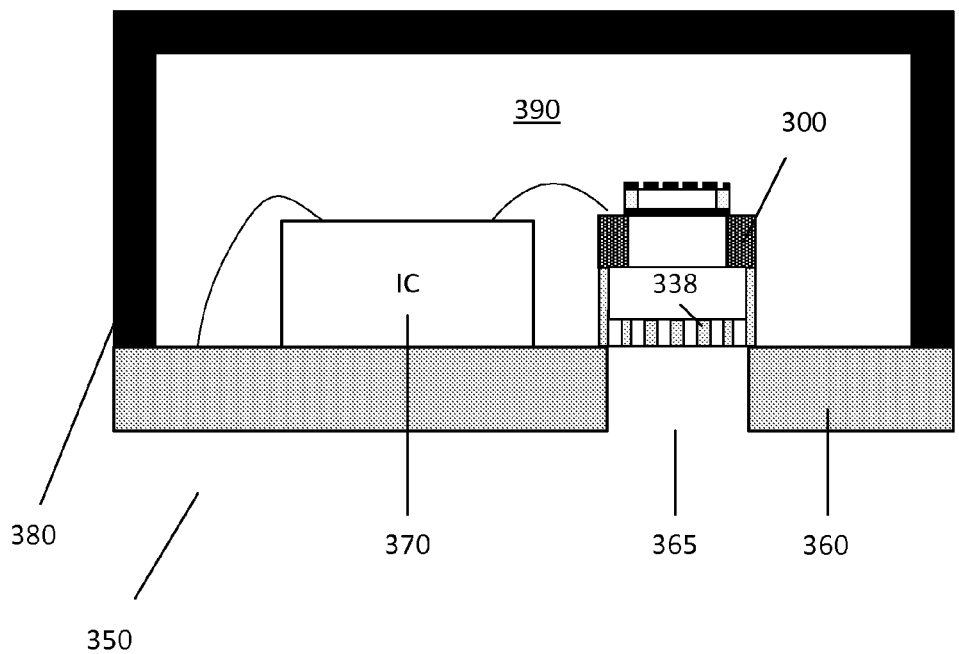
FIG. 3b shows an embodiment of a packaged MEMS device.

FIG. 3a shows an embodiment of a MEMS device 300 and FIG. 3b shows an integrated MEMS system or a packaged MEMS device 350.

The MEMS device 300 comprises a MEMS structure (e.g., a MEMS stack) 310, a substrate 320, and a polymer layer 330. The substrate 320 may comprise a semiconductive material such as silicon or germanium, or a compound semiconductor such as SiGe, GaAs, InP, GaN or SiC. Alternatively, the substrate 320 may comprise organic materials such as glass or ceramic. The substrate 320 may comprise a thickness of 100 μm to 150 μm, 100 μm to 200 μm or 100 μm to 300 μm.

The MEMS structure 310 may be disposed on a first main surface of the substrate 320. The MEMS structure 310 may be a MEMS stack. The MEMS structure 310 may comprise a structure for sensing an empirical signal. For example, the MEMS stack 310 comprises a membrane 311, a backplate 312 and spacers 313 between the membrane 311 and the backplate 313. In one embodiment the MEMS stack 310 comprises a backplate 311 as a top layer. Alternatively, the MEMS stack 310 comprises a backplate as a top layer. The MEMS stack 310 may comprise other or additional material layers.

The polymer film 330 may be a photo structurable polymer film. In one embodiment the polymer film 330 may be an epoxy based negative photoresist. For example, the polymer film 330 may be SU-8 resist. The SU-8 resist comprises a chemically amplified, epoxy based negative resist that is optically transparent and photo imagable to near UV (e.g., 365 nm) radiation. Cured SU-8 resist films or microstructures are very resistant to solvents, acids and bases and have excellent thermal and mechanical stability. The polymer film 330 may comprise a thickness of about 50 μm to about 100 μm, a thickness of about 100 μm to about 200 μm or to a thickness of about 50 μm to about 300 μm.

The substrate 320 comprises an opening, cavity or chamber 325 and the polymer layer 330 comprises an opening, cavity or chamber 335. The substrate 320 may comprise one opening 325 abutting the MEMS structure 310 or may comprise a plurality of openings abutting the MEMS structure 310. The opening 325 may be round comprising a circle or an oval, or angular such as a rectangle or a square. The polymer layer 330 may comprise an opening 335 abutting the opening 325. The opening 335 may be round comprising a circle or an oval, or angular such as a rectangle or a square. In various embodiments, the opening 335 is larger than the opening 325. In other embodiments the opening 335 is smaller or is the same as the opening 325. In some embodiments the opening 335 may comprise a diameter of about 0.5 mm to about 1.5 mm and the opening 325 may comprise a diameter of about 50 μm to about 100 μm. The opening 335 may be arranged at the interface (e.g., top surface) between the substrate 320 and the polymer layer 330.

The polymer layer 330 may further comprise small openings 337 in the bottom surface. The small openings 337 together with the remains of the polymer layer 330 in that region may form a protection region 338. The protection region 338 may comprise a perforated polymer layer region.

The protection region 338 is configured to protect the MEMS structure 310 against oncoming particles 340, for example.

In various embodiments the small openings 337 and the chambers 325, 335 form a low pass filter. The openings 337 may represent a resistive acoustic element and the chambers 325 and 335 may represent an acoustical capacitive element. Together, they form an acoustical RC low pass filter. The RC low pass filter can be used to filter ultra-sonic distortion signals or to damp acoustical resonances that are generated, for example, by the sound port of the package.

The embodiment of FIG. 3b shows a system, a module or a packaged MEMS device 350. The system or package MEMS device 350 comprises a component carrier 360, an aperture 365, an integrated circuit (IC) 370, a MEMS device 300 and a cap, cover, housing, casing or encapsulation 380. The component carrier 360 may be a ceramic, a laminate or a printed circuit board (PCB). The aperture 365 may be sound port or other port configured to receive incoming signals. The incoming signals may be empiric signals such as sound. The IC 370 may be a stand-alone device or an integrated circuit configured to provide a single functionality or a plurality of functionalities. For example, the IC 370 may be an A/D converter. Alternatively, the IC 370 may be a controller.

The cap 380 may be a molding compound, a laminate or a casing such as metal lid casing or plastic lid casing. The cap 380 may partially cover, enclose or encapsulate the component carrier 380 and completely encapsulate the MEMS device 300 and the IC 370. The cap 380 may completely or partially cover the wires and/or the conductive clips which connect the IC 370 to the component carrier 360 and the MEMS device 300.

The cap 380 may comprise thermosetting materials such as an epoxy, a polyimide, a polyurethane or a polyacrylate compound, or a metal. Alternatively the cap 380 may comprise thermoplastic materials such as polysulfones, polyphenylen sulfides, or polyetherimides. In one embodiment the cap material may be a laminate such as a prepreg.

In one embodiment the MEMS device 300 is placed on the aperture 365 such that the protection region 338 of the polymer layer 330 is directly disposed over the aperture 365. In one embodiment the protection region 338 comprises a hydrophobic or water repellent region. Alternatively, the protection region 338 comprises a lipophobic or oil repellent region. In one embodiment the protection region 338 is water- and oil-repellent region.

Figure 4A:
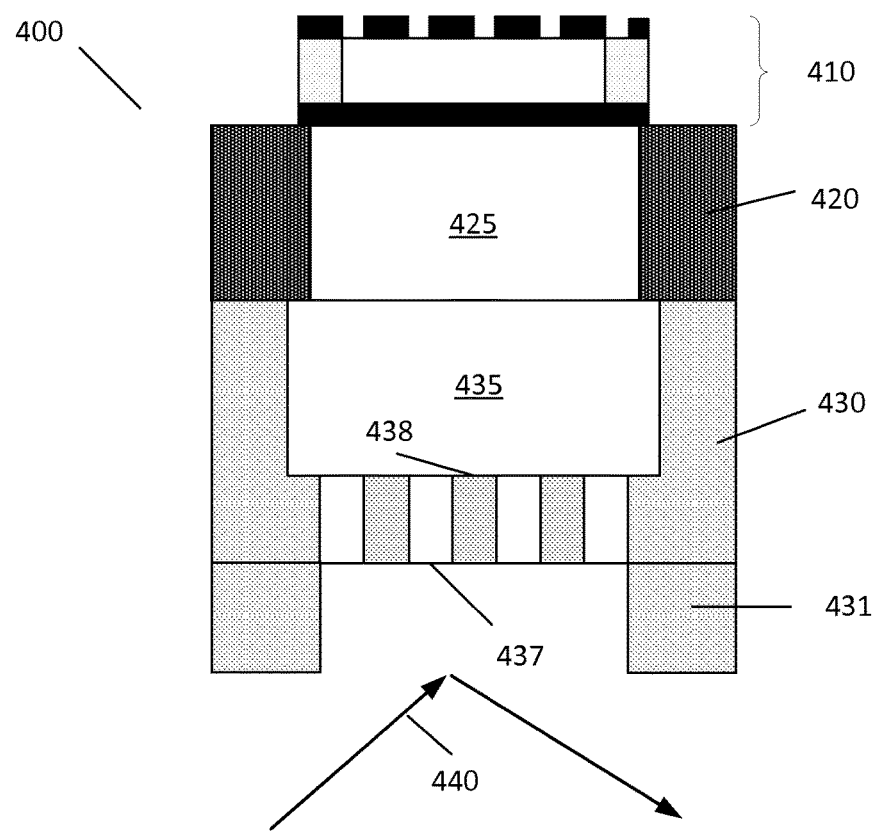
FIG. 4a shows a further embodiment of a MEMS device.
Figure 4B:
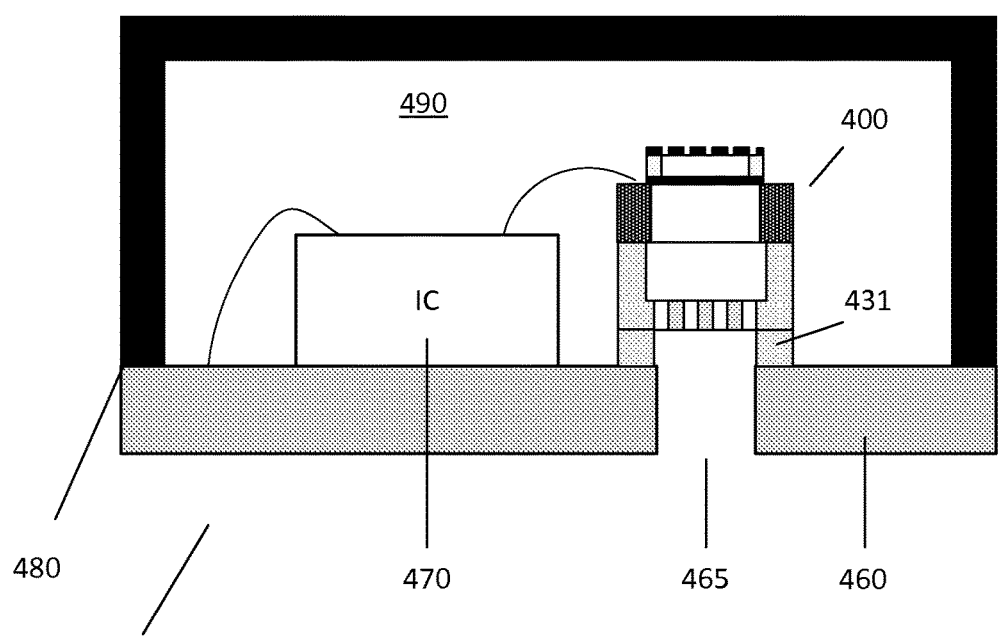
FIG. 4b shows a further embodiment of a packaged MEMS device.

FIG. 4a shows an embodiment of a MEMS device 400 and FIG. 4b shows an integrated MEMS system or a packaged MEMS device 450.

The MEMS device 400 comprises a MEMS structure (e.g., a MEMS stack) 410, a substrate 420, and a polymer layer 430. The MEMS device 400 may comprise similar or the same elements, materials and dimensions as the embodiment of the MEMS device 300.

The substrate 420 comprises an opening, cavity or chamber 425 and the polymer layer 430 comprises an opening, cavity or chamber 435. The substrate 420 may comprise one opening 425 abutting the MEMS structure 410 or may comprise a plurality of openings abutting the MEMS structure 410. The openings 425, 435 may be round comprising a circle or an oval, or angular such as a rectangle or a square. The opening 435 may abut the opening 425. In various embodiments the opening 435 may be larger than the opening 425. In other embodiments the opening 435 may be smaller than or the same as the opening 425. In some embodiments the opening 435 may comprise a diameter of about 0.5 mm to about 1.5 mm and the opening 425 may comprise a diameter of about 50 μm to about 100 μm. The opening 435 may be arranged at the interface (e.g., top surface) between the substrate 420 and the polymer layer 430.

The polymer layer 430 may further comprise small openings 437 in the bottom surface. The small openings 437 together with the remains of the polymer layer 430 in this region may form a protection region 438. The protection region 438 may comprise a perforated polymer layer region. The protection region 438 is configured to protect the MEMS structure 410 against oncoming particles 440, for example. The polymer layer 430 may comprise spacers 431. The spacers 431 may comprise a width of about 50 μm to about 200 μm.

The embodiment of FIG. 4b shows a system, a module or a packaged MEMS device 450. The system or package MEMS device 450 comprises a component carrier 460, an aperture 465, an integrated circuit (IC) 470, a MEMS device 400 and a cap, cover, housing, casing or encapsulation 480. The packaged MEMS device 450 may comprise similar or the same elements, materials and dimensions as the embodiment of the MEMS device 350. In one embodiment the MEMS device 400 is placed on the aperture 465 such that the protection region 438 of the polymer layer 430 is spaced from the top surface of the aperture 465 by the spacers 431.

Figure 5A:
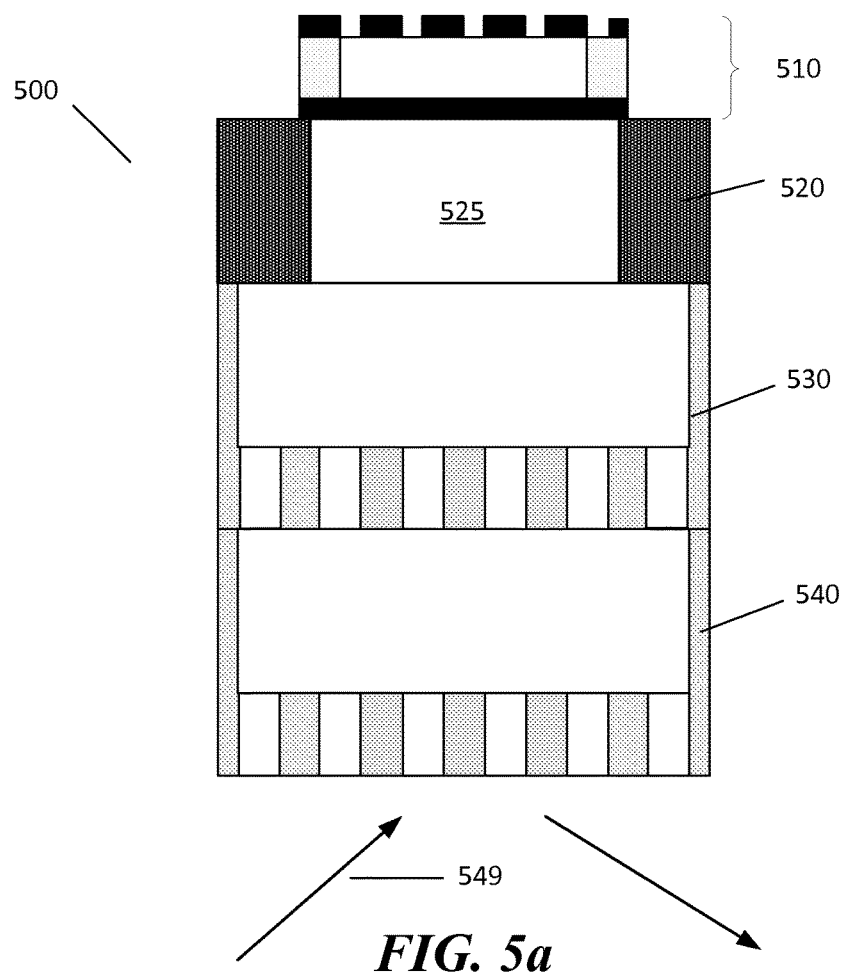
FIG. 5a shows another embodiment of a MEMS device.
Figure 5B:
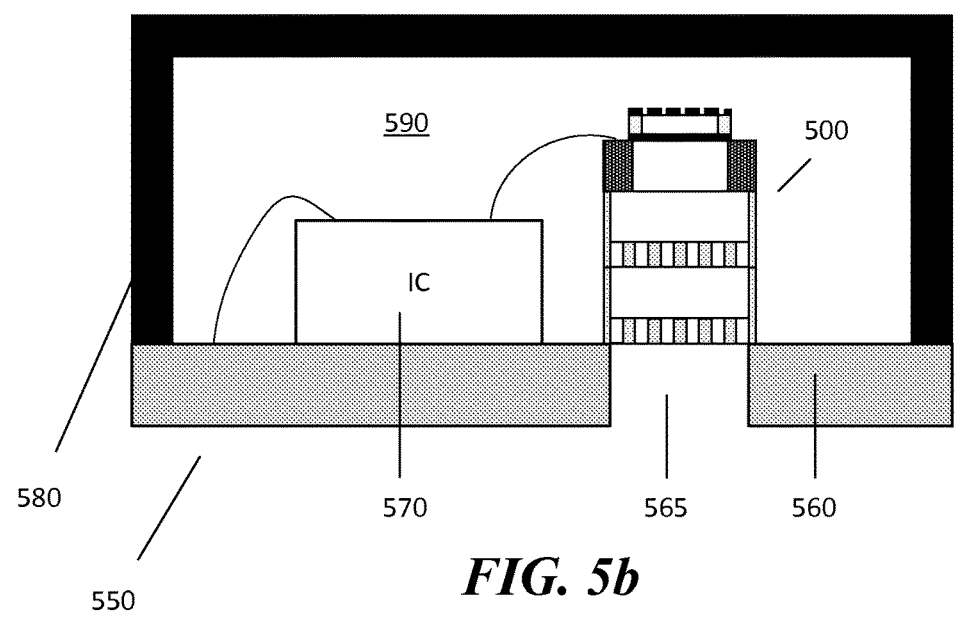
FIG. 5b shows another embodiment of a packaged MEMS device.

FIG. 5a shows an embodiment of a MEMS device 500 and FIG. 5b shows an integrated MEMS system or a packaged MEMS device 550.

The MEMS device 500 comprises a MEMS structure (e.g., MEMS stack) 510, a substrate 520, and a polymer layer 530. The MEMS device 500 may comprise similar or the same elements, materials and dimensions as the embodiments of the MEMS device 300 or 400.

The substrate 520 comprises an opening, cavity or chamber 525, the first polymer layer 530 comprises a first opening, first cavity or first chamber 535 and the second polymer layer 540 comprises a second opening, second cavity or second chamber 545. The substrate 520 may comprise one opening 525 abutting the MEMS structure 510 or may comprise a plurality of openings abutting the MEMS structure 510. The opening 525, 535, 545 may be round comprising a circle or an oval, or angular comprising a rectangle or a square.

The first polymer layer 530 may comprise a first opening 535 abutting the opening 525. In various embodiments the first opening 535 is larger than the opening 525. In other embodiments the first opening 535 is smaller than or the same as the opening 525. The first openings 535 may comprise a diameter of about 0.5 mm to about 1.5 mm and the opening 525 may comprise a diameter of about 50 μm to about 100 μm. The first opening 535 may be arranged at the interface (e.g., top surface) between the substrate 520 and the first polymer layer 530.

The first polymer layer 530 may further comprise small first openings 537 in the bottom surface. The small first openings 537 together with the remains of the first polymer layer 530 may form a first protection region 538. The first protection region 538 may comprise a first perforated polymer layer region. The first protection region 538 is configured to protect the MEMS device 500 against oncoming particles 549, for example.

The second polymer layer 540 may comprise a second opening 545 abutting the first opening 535. In various embodiments the second opening 545 may be larger than or the same as the opening 525 and/or the first opening 535. In some embodiments the second opening 545 is smaller than the opening 525 and/or the first opening 535. The openings 535, 545 may comprise a diameter of about 0.5 mm to about 1.5 mm (+/−25 μm to 100 μm) and the opening 425 may comprise a diameter of about 50 μm to about 100 μm. The second opening 545 may be arranged at the interface (e.g., top surface) between the first polymer layer 530 and the second polymer layer 540.

The second polymer layer 540 may further comprise small second openings 547 in the bottom surface. The small second openings 547 together with the remains of the second polymer layer 540 may form a second protection region 548. The second protection region 548 may comprise a perforated polymer layer region. The second protection region 548 is configured to protect the MEMS structure 510 against oncoming particles 549, for example.

In some embodiments the chamber 535, 537 and the chamber 545, 547 may form two high low pass filters in series with the same cut off frequency (providing a second order effect). In alternative embodiments, the chambers 535, 537, 545, 547 form two low pass filters with different cut off frequencies.

The embodiment of FIG. 5b shows a system, module or packaged MEMS device 550. The system or package MEMS device 550 comprises a component carrier 560, an aperture 565, an integrated circuit (IC) 570, a MEMS device 500 and a cap, cover, housing, casing or encapsulation 580. The packaged MEMS device 550 may comprise similar or the same elements, materials and dimensions as the embodiment of the MEMS devices 350 or 450. In one embodiment the MEMS device 500 is placed on the aperture 565 such that the second protection regions 548 of the second polymer layer 540 is disposed directly on the top surface of the aperture 465.

Figure 6A:
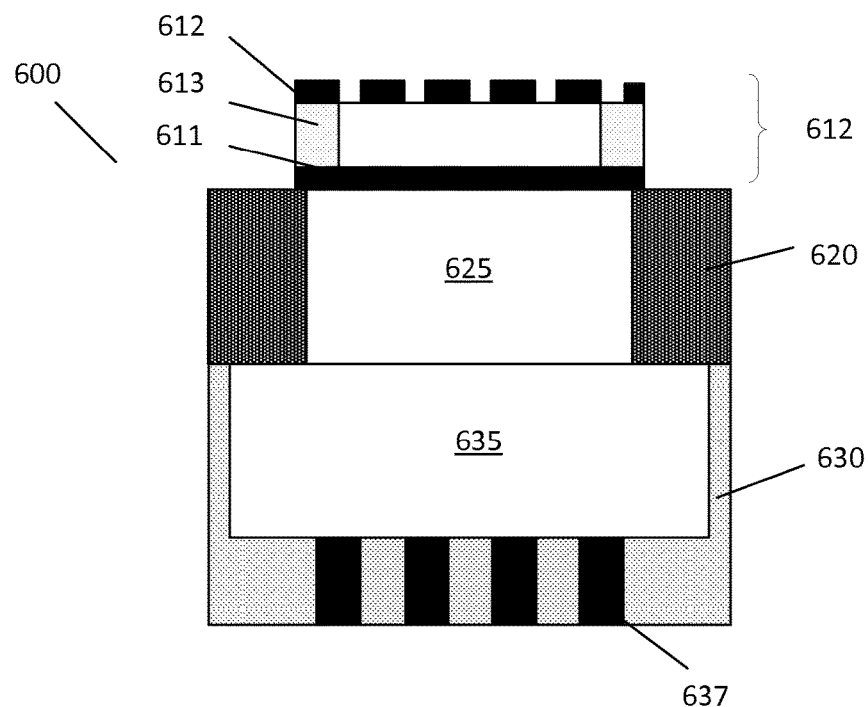
FIG. 6a shows yet another embodiment of a MEMS device.
Figure 6B:
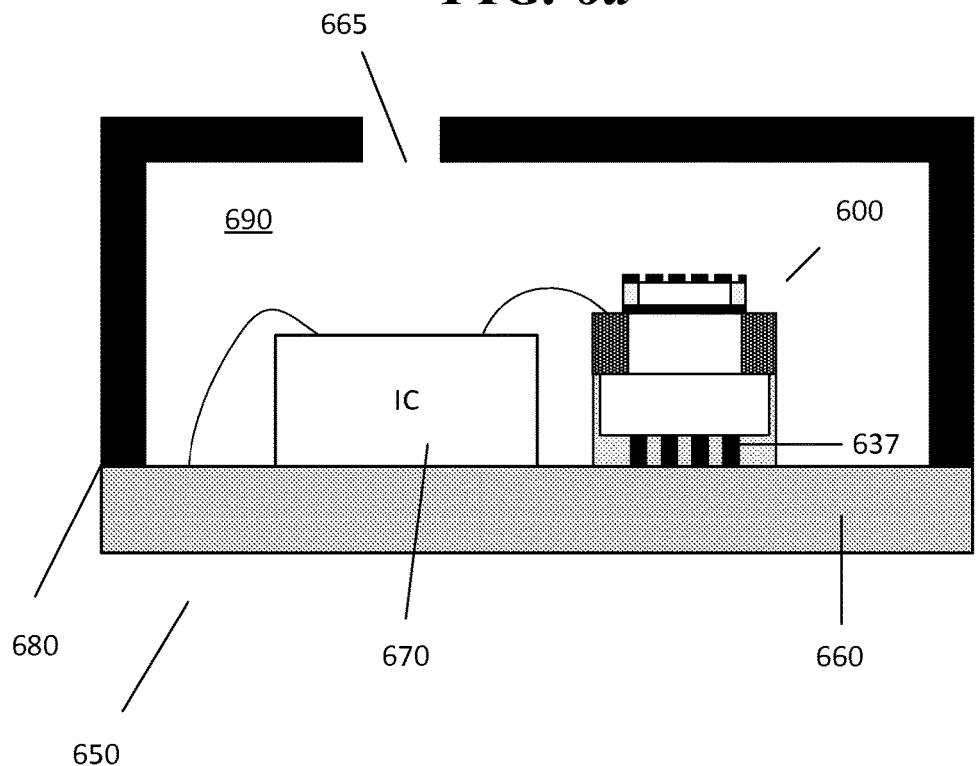
FIG. 6b shows yet another embodiment of a packaged MEMS device.

FIG. 6a shows an embodiment of a MEMS device 600 and FIG. 6b shows an integrated MEMS system or a packaged MEMS device 650.

The MEMS device 600 comprises a MEMS structure (e.g., stack) 610, a substrate 620, and a polymer layer 630. The substrate 620 may comprise a semiconductive material such as silicon or germanium, or a compound semiconductor such as SiGe, GaAs, InP, GaN or SiC. Alternatively, the substrate 620 may comprise organic materials such as glass or ceramic. The substrate 620 may comprise a thickness of 100 μm to 200 μm or 100 μm to 300 μm.

The MEMS structure 610 may be a MEMS stack. The MEMS structure 610 may comprise a structure for sensing an empirical signal. For example, the MEMS stack 610 may comprise a membrane 611, a backplate 612 and spacers 613 between the membrane 611 and the backplate 613. In one embodiment the MEMS stack 610 comprises a backplate 611 as a top layer. Alternatively, the MEMS stack 610 comprises a backplate as a top layer. The MEMS stack 610 may comprise other or additional material layers.

The polymer film 630 may be a photo structurable polymer film. In one embodiment the polymer film 630 may be an epoxy based negative photoresist. For example, the polymer film 630 may be SU-8 resist. The SU-8 resist comprises a chemically amplified, epoxy based negative resist that is optically transparent and photo imagable to near UV (e.g., 365 nm) radiation. Cured SU-8 resist films or microstructures are very resistant to solvents, acids and bases and have excellent thermal and mechanical stability. The polymer film 630 may comprise a thickness of about 50 μm to about 100 μm, a thickness of about 100 μm to about 200 μm or to a thickness of about 50 μm to about 300 μm.

The substrate 620 comprises an opening 625 and the polymer layer 630 comprises an opening 635. The substrate 620 may comprise one opening 625 abutting the MEMS stack 610 or may comprise a plurality of openings abutting the MEMS stack 610. The openings 625, 635 may be round comprising a circle or an oval, or angular comprising a rectangle or a square. The polymer layer 630 may comprise an opening 635 abutting the opening 625. In various embodiments the opening 635 may be larger than the opening 625. In other embodiments the opening 635 may be smaller than or the same as the opening 625. The opening 635 may comprise any geometrical dimension. The opening 635 may comprise a height of about 50 μm and about 200 μm. The polymer layer 630 in the MEMS device 600 may comprise width of about 100 μm to about 200 μm. The opening 635 may be arranged at the interface (e.g., top surface) between the substrate 620 and the polymer layer 630.

The polymer layer 630 may further comprise plugs 637 in the bottom surface. The plugs 637 may be small plugs 637. The plugs 637 may comprise a polymeric material or may be simply glued to the printed circuit board.

In various embodiments the polymer layer 630 may comprise a first polymer layer and a second polymer layer having the same or different openings which are connected to each other.

The embodiment of FIG. 6b shows a system, module or packaged MEMS device 650. The system or packaged MEMS device 650 comprises a component carrier 660, an aperture 665, an integrated circuit (IC) 670, a MEMS device 600 and a cap, cover, housing, casing or encapsulation 680. The component carrier 660 may be a ceramic, a laminate or a printed circuit board (PCB). The IC 670 may be a stand-alone device or an integrated circuit configured to provide a single functionality or a plurality of functionalities. For example, the IC 670 may be an A/D converter. Alternatively, the IC 670 may be a controller. The MEMS device 600 and the IC 670 are disposed on the component carrier 660.

The cap 680 may be a molding compound, a laminate or a casing such as metal lid casing or plastic lid casing. The cap 680 may partially cover the component carrier 660 and completely cover the MEMS device 600 and the IC 670. The cap 680 may completely or partially cover the wires and/or the conductive clips which connect the IC 670 to the component carrier 660 and the MEMS device 600. The cap 680 comprises an opening, cavity or chamber 690.

The cap 680 may comprise thermosetting materials such as an epoxy, a polyimide, a polyurethane or a polyacrylate compound, or a metal. Alternatively the cap 680 may comprise thermoplastic materials such as polysulfones, polyphenylen sulfides, or polyetherimides. In one embodiment the cap material may be a laminate such as a prepreg.

The cap 680 comprises an aperture 665. The aperture 665 may be sound port or other port configured to receive incoming signals. The incoming signals may be empiric signals such as sound. In various embodiments the aperture 665 is disposed in the top surface of the cap 680. In other embodiments the aperture 665 is disposed on sidewalls of the cap 680.

Figure 7A:
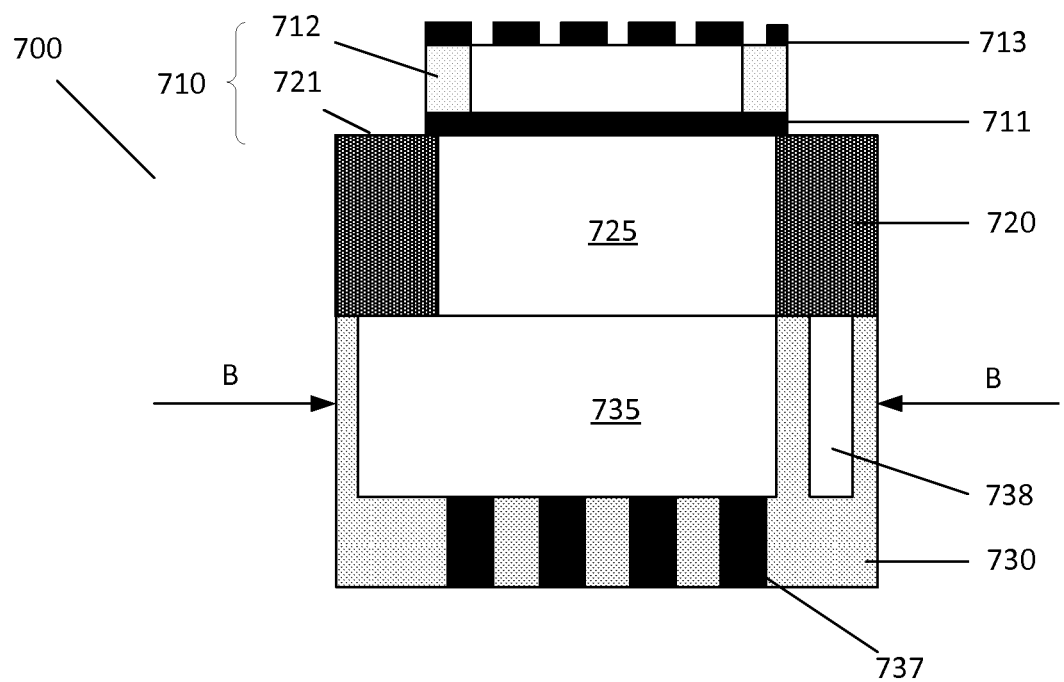
FIGS. 7a and 7b show cross-sectional views of an embodiment of a MEMS device.
Figure 7B:
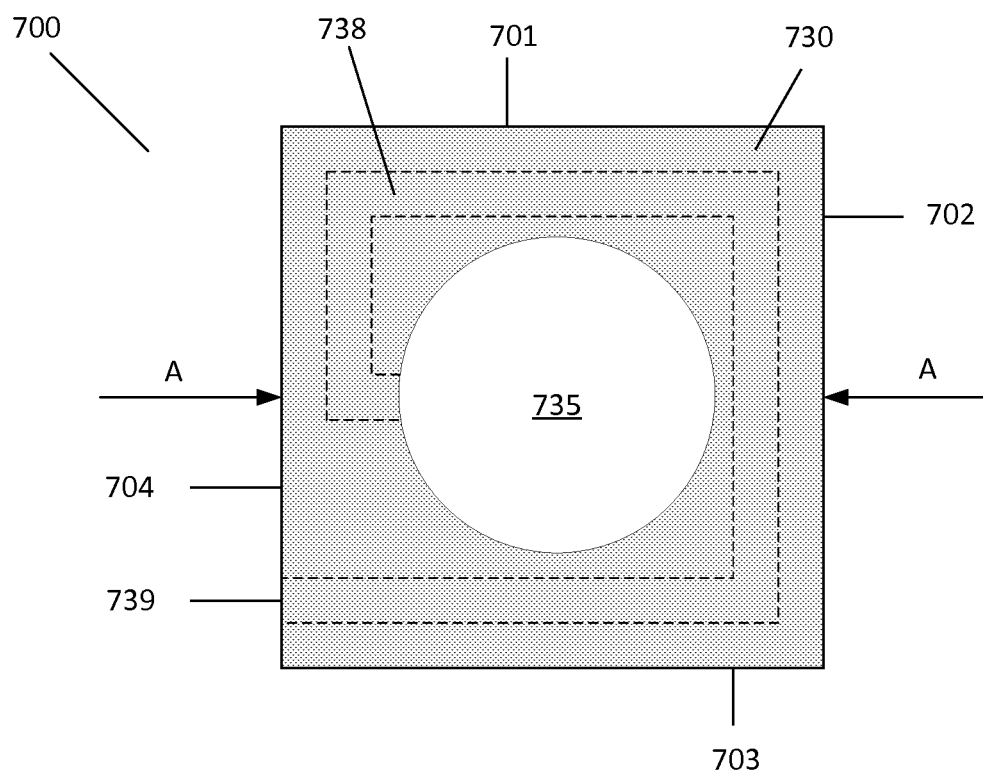

FIGS. 7a and 7b show an embodiment of a MEMS device 700. FIG. 7a is a cross-sectional view of the MEMS device 700 along line A-A of FIG. 7b and FIG. 7b is a cross sectional view of the MEMS device 700 along line B-B of FIG. 7a. FIG. 7a shows a MEMS device 700 comprising a MEMS structure 710, a substrate 720 and a polymer layer 730. The MEMS structure 710 is disposed on a first main surface 721 of the substrate 720. In various embodiments the MEMS device 700 is a silicon microphone. In alternative embodiments the MEMS device 700 is a sensor or transducer.

The MEMS structure 710 may be a MEMS stack. The MEMS structure 710 may comprise a structure for sensing an empirical signal. For example, the MEMS stack 710 comprises a membrane 711, a backplate 712 and spacers 713 between the membrane 711 and the backplate 713. In one embodiment the MEMS stack 710 comprises a membrane 711 as a top layer. Alternatively, the MEMS stack 710 comprises a backplate as a top layer.

The MEMS device 700 may comprise a microphone or a silicon microphone. Alternatively, the MEMS device 700 comprises a transducer. The transducer may be a sensor such as a pressure sensor, an accelerometer, or a RF MEMS. The MEMS device 700 may be a stand-alone device or an integrated circuit (IC). The integrated circuit may comprise a pre-amplifier and input/output terminals. Moreover, the integrated circuit IC may comprise an A/D converter or transistors, etc.

The substrate 720 may comprise a semiconductive material such as silicon or germanium, or a compound semiconductor such as SiGe, GaAs, InP, GaN or SiC. Alternatively, the substrate 720 may comprise organic materials such as glass or ceramic. The substrate may comprise a thickness of 100 μm to 200 μm or 100 μm to 300 μm.

The polymer film 730 may be a photo structurable polymer film. In one embodiment the polymer film 730 may be an epoxy based negative photoresist. For example, the polymer film 730 may be SU-8 resist. The SU-8 resist comprises a chemically amplified, epoxy based negative resist that is optically transparent and photo imagable to near UV (e.g., 365 nm) radiation. Cured SU-8 resist films or microstructures are very resistant to solvents, acids and bases and have excellent thermal and mechanical stability. The polymer film 730 may comprise a thickness of about 50 μm to about 100 μm, a thickness of about 100 μm to about 200 μm or to a thickness of about 50 μm to about 300 μm.

The substrate 720 comprises an opening, cavity or chamber 725 and the polymer layer 730 comprises an opening, cavity or chamber 735. The substrate 720 may comprise one opening 725 abutting the MEMS structure 710 or may comprise a plurality of openings 725 abutting the MEMS structure 710. The openings 725, 735 may be round comprising a circle or an oval, or angular comprising a rectangle or a square. The opening 735 of the polymer layer 730 is abutting the opening 725. In various embodiments the opening 735 is larger than the opening 725. In other embodiments the opening 735 is smaller than or the same as the opening 725.

The MEMS device 700 comprises a ventilation channel such as an acoustic ventilation channel 738. The ventilation channel 738 is disposed in the polymer layer 730. The ventilation channel 738 comprises an outlet 739. The ventilation channel 738 may wind around or may partially wind around the opening 735. The ventilation channel 738 may meander through the polymer layer 730. In various embodiments the outlet 739 is located at any of the sidewalls 701-704 but does not comprise a straight access to the opening 735.

In one embodiment the MEMS device 700 comprises plugs 737 in a bottom region of the polymer layer 730. Alternatively, the MEMS device 700 comprises openings 737 (e.g., sound port) in the bottom region of the polymer layer 730.

Figure 8A:
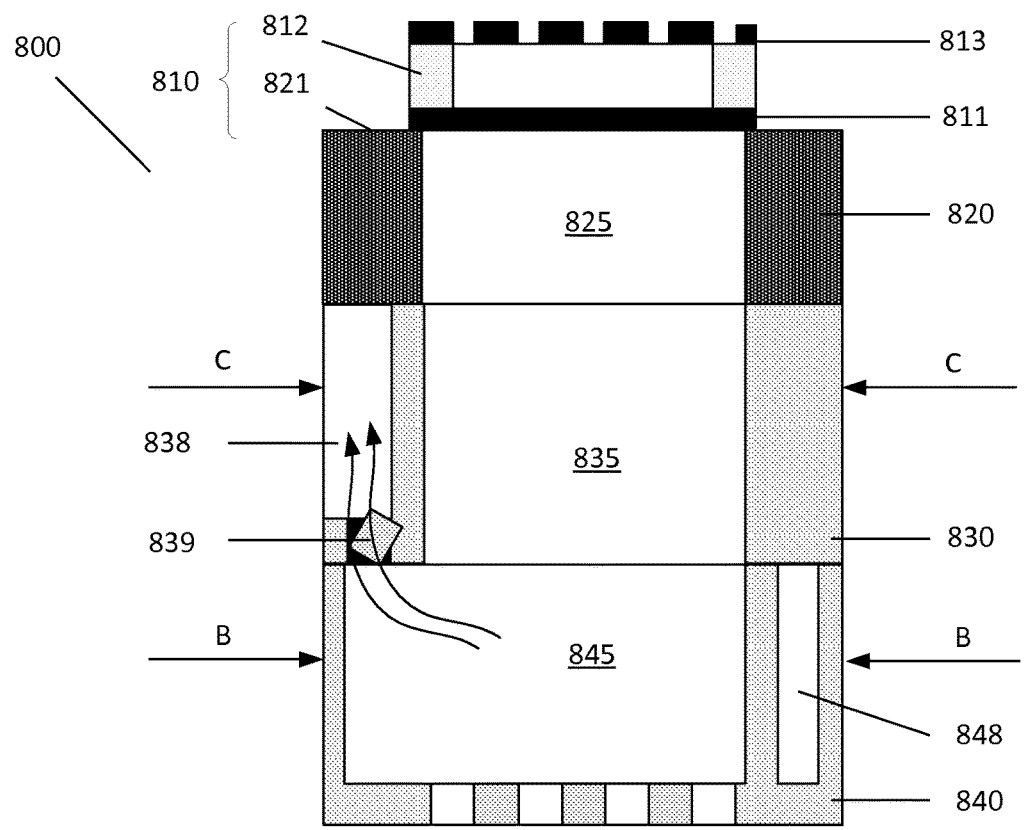
FIGS. 8a-8c show cross-sectional views of another embodiment of a MEMS device.
Figure 8B:
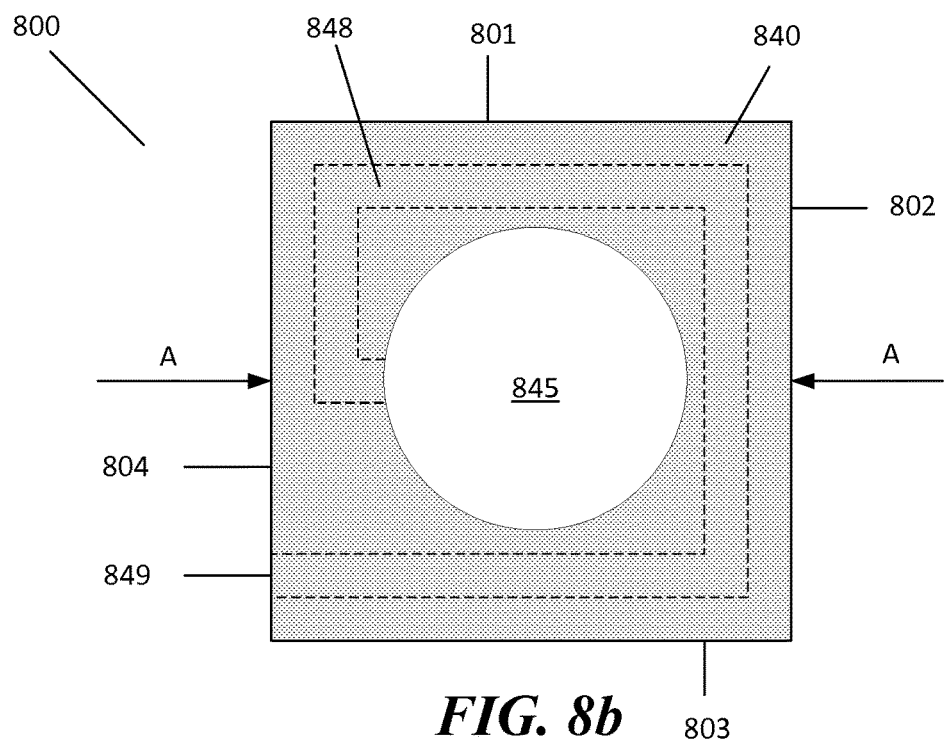
Figure 8C:
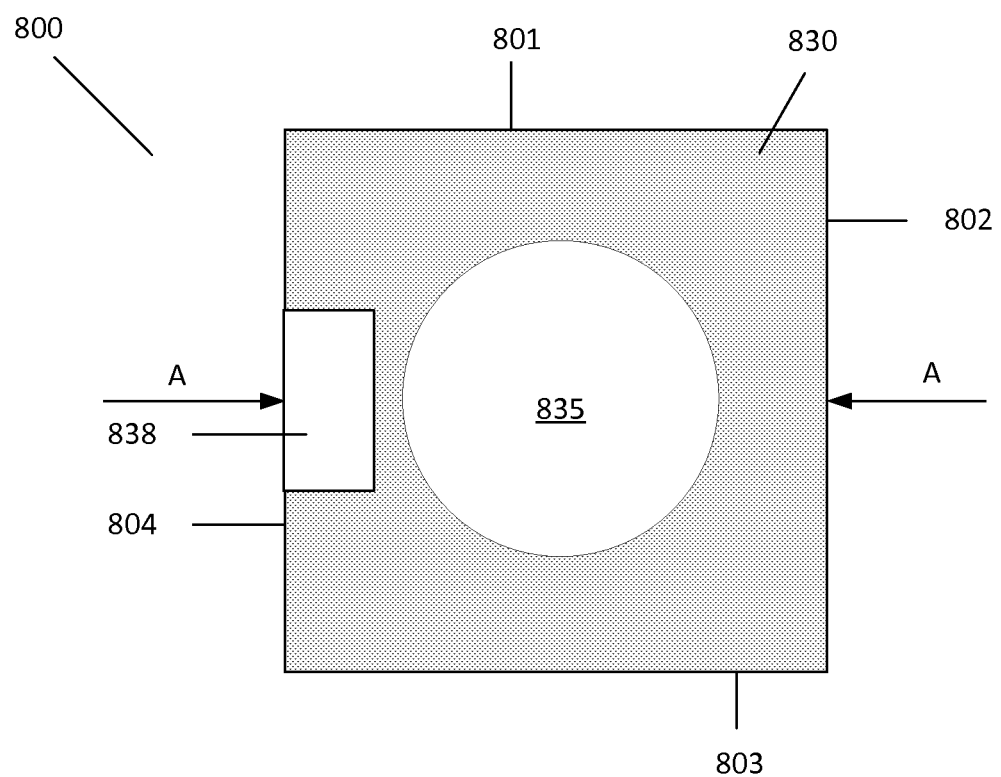

FIGS. 8a-8c show an embodiment of a MEMS device 800. FIG. 8b is a cross-sectional view along line B-B of FIG.

8a and FIG. 8c is a cross sectional view along line C-C of FIG. 8a. FIG. 8a shows a cross-sectional view along lines A-A of FIGS. 8b and 8c. FIG. 8a shows a MEMS device 800 comprising a MEMS structure 810, a substrate 820 and polymer layers 830 and 840. The MEMS structure 810 is disposed on a first main surface 821 of the substrate 820. In various embodiments the MEMS device 800 is a silicon microphone. In alternative embodiments the MEMS device 800 is a sensor or transducer.

The MEMS structure 810 may be a MEMS stack. The MEMS structure 810 may comprise a structure for sensing an empirical signal. The MEMS stack 810 comprises a membrane 811, a backplate 812 and spacers 813 between the membrane 811 and the backplate 812. In one embodiment the MEMS stack 810 comprises a membrane 811 as a top layer. Alternatively, the MEMS stack 810 comprises a backplate as a top layer.

The MEMS device 800 may comprises a microphone or a silicon microphone. Alternatively, the MEMS device 800 may comprise a transducer. The transducer may be a sensor such as a pressure sensor, an accelerometer, or a RF MEMS. The MEMS device 800 may be a stand-alone device or an integrated circuit (IC). The integrated circuit may comprise a pre-amplifier and input/output terminals. Moreover, the integrated circuit IC may comprise an A/D converter or transistors, etc.

The substrate 820 may comprise a semiconductive material such as silicon or germanium, or a compound semiconductor such as SiGe, GaAs, InP, GaN or SiC. Alternatively, the substrate 820 may comprise organic materials such as glass or ceramic. The substrate may comprise a thickness of 100 μm to 200 μm or 100 μm to 300 μm.

The first polymer film 830 may be a photo structurable polymer film. In one embodiment the polymer film may be an epoxy based negative photoresist. For example, the polymer film may be SU-8 resist. The SU-8 resist comprises a chemically amplified, epoxy based negative resist that is optically transparent and photo imagable to near UV (e.g., 365 nm) radiation. Cured SU-8 resist films or microstructures are very resistant to solvents, acids and bases and have excellent thermal and mechanical stability. The polymer film may comprise a thickness of about 50 μm to about 100 μm, a thickness of about 100 μm to about 200 μm or to a thickness of about 50 μm to about 300 μm.

The MEMS device 800 may comprise a second polymer layer 840 abutting the first polymer layer 830. The additional polymer layer 840 may comprise the same properties and dimensions than the first polymer layer 830 except as discussed below.

The substrate 820 comprises an opening, cavity or chamber 825, the first polymer layer 830 comprises an opening, cavity or chamber 835 and the second polymer layer 840 comprises an opening, cavity or chamber 845. The openings 825, 835, 845 may be round comprising a circle or an oval, or angular such as a rectangle or a square. In various embodiments the opening 835 of the first polymer layer 830 is abutting the opening 825 and the opening 845 of the second polymer layer 840 us abutting the opening 835. In various embodiments the openings 835, 845 are larger than the opening 825. In some embodiments the opening 835, 845 are smaller than or the same as the opening 825. In other embodiments the openings 835, 845 vary in size from each other.

The MEMS device 800 comprises a low resistant ventilation channel 848 such as an acoustic low resistant ventilation channel 848. The low resistant ventilation channel 848 is disposed in the polymer layer 840. The low resistant ventilation channel 848 comprises an outlet 849. The low resistant ventilation channel 848 may wind around or may partially wind around the opening 845. The low resistant ventilation channel 848 may meander through the polymer layer 840. In some embodiments the outlet 849 is located at one of the sidewalls 801-804 but does not comprise a straight access to the opening 845.

The MEMS device 800 further comprises a high resistant ventilation channel 838. The high resistant ventilation channel 838 is accessed through vent or over-pressure valve 839. In one embodiment, the over-pressure valve 839 opens only when there is high pressure on the MEMS device 800.

The embodiment of FIGS. 8a-8c may bypass extreme input sound signals (pressures) directly into the back-volume of a cap (as shown in embodiments of FIGS. 3b-5b). Such a configuration has the advantage that the sensitive MEMS structure 810 of the MEMS device 800 is not penetrated by these extreme sound signals.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a MEMS device, the method comprising:
   forming a MEMS structure supported by a substrate;
   forming a polymer layer on the substrate;
   forming a second polymer layer on the polymer layer;
   exposing the polymer layer to a first pattern with a first light having a first wavelength;
   exposing the polymer layer to a second pattern with a second light having a second wavelength different from the first wavelength;
   exposing the second polymer layer to a third pattern with a third light; and
   exposing the second polymer layer to a fourth pattern with a fourth light, wherein the third pattern and the first pattern are a same pattern, the third light and the first light are a same light, the fourth pattern and the second pattern are a same pattern, and the fourth light and the second light are a same light.

2. The method according to claim 1, further comprising removing unexposed portions of the polymer layer thereby forming a first opening in the polymer layer.

3. The method according to claim 2, further comprising developing and baking the polymer layer.

4. The method according to claim 3, further comprising etching the substrate thereby opening an area underneath the MEMS structure.

5. The method according to claim 2, wherein removing unexposed portions of the polymer layer further comprises forming a plurality of second openings in the polymer layer.

6. The method according to claim 5, further comprising developing and baking the polymer layer.

7. The method according to claim 6, further comprising etching the substrate thereby opening an area underneath the MEMS structure.

8. The method according to claim 7, further comprising forming plugs in the plurality of second openings.

9. The method according to claim 2, wherein removing unexposed portions of the polymer layer further comprises forming a ventilation channel in the polymer layer.

10. The method according to claim 2, wherein removing unexposed portions of the polymer layer further comprises forming an over pressure valve in the polymer layer.

11. The method according to claim 1, further comprising thinning the substrate.

12. The method according to claim 1, wherein the MEMS structure is a MEMS stack comprising a backplate and a membrane, the method further comprising etching a sacrificial layer in the MEMS stack thereby releasing the membrane in MEMS stack and forming spacers in the MEMS stack.

13. The method according to claim 1, further comprising forming spacers on the polymer layer.

14. The method of claim 1, wherein the first wavelength is less than the second wavelength.

15. A method for manufacturing a MEMS device, the method comprising:
   disposing a MEMS structure at a semiconductor substrate, wherein the MEMS structure comprises a membrane, a back plate, and a spacer between the membrane and the back plate;
   disposing a first polymer layer on the semiconductor substrate;
   forming a first opening in the first polymer layer; and
   forming a second opening in the semiconductor substrate, wherein forming the first opening in the first polymer layer comprises:
      exposing the first polymer layer to a first pattern with a first light having a first wavelength;
      exposing the first polymer layer to a second pattern with a second light having a second wavelength, the second wavelength of the second light being greater than the first wavelength of the first light; and
      removing unexposed portions of the first polymer layer.

16. The method according to claim 15, further comprising forming a plurality of small openings in the first polymer layer, wherein the plurality of small openings connects the first opening to a surface of the first polymer layer.

17. The method according to claim 16, further comprising forming plugs in the plurality of small openings.

18. The method according to claim 15, further comprising forming a ventilation channel in the first polymer layer.

19. The method according to claim 15, further comprising:
   disposing a second polymer layer on the first polymer layer;
   forming a third opening in the second polymer layer; and
   forming a plurality of small openings in the second polymer layer, wherein the plurality of small openings connects the third opening to a surface of the second polymer layer.

* * * * *